United States Patent
Li et al.

(10) Patent No.: US 8,345,468 B2
(45) Date of Patent: Jan. 1, 2013

(54) CAPACITY AND DENSITY ENHANCEMENT CIRCUIT FOR SUB-THRESHOLD MEMORY UNIT ARRAY

(75) Inventors: Jie Li, Jiangsu (CN); Na Bai, Jiangsu (CN); Ming Ling, Jiangsu (CN); Aiguo Bu, Jiangsu (CN); Chao Wang, Jiangsu (CN); Chen Hu, Jiangsu (CN)

(73) Assignee: Southeast University, Jiangsu (CN)

( * ) Notice: Subject to any disclaimer, the term of this patent is extended or adjusted under 35 U.S.C. 154(b) by 0 days.

(21) Appl. No.: 13/322,114

(22) PCT Filed: Aug. 18, 2009

(86) PCT No.: PCT/CN2009/073248
§ 371 (c)(1),
(2), (4) Date: Nov. 22, 2011

(87) PCT Pub. No.: WO2011/020225
PCT Pub. Date: Feb. 24, 2011

(65) Prior Publication Data
US 2012/0069635 A1 Mar. 22, 2012

(51) Int. Cl.
G11C 11/24 (2006.01)
(52) U.S. Cl. .......... 365/149; 365/154; 365/51; 365/226; 365/189.03; 365/189.06; 365/189.08

(58) Field of Classification Search .................. 365/149, 365/154, 51, 52, 226, 189.03, 189.06, 189.08
See application file for complete search history.

(56) References Cited

U.S. PATENT DOCUMENTS

| | | | |
|---|---|---|---|
| 6,061,268 A | 5/2000 | Kuo et al. | |
| 6,285,578 B1 | 9/2001 | Huang | |
| 6,781,917 B2 * | 8/2004 | Nagaoka | 365/230.05 |
| 6,868,000 B2 * | 3/2005 | Chan et al. | 365/154 |
| 6,876,208 B2 * | 4/2005 | Kunikiyo et al. | 324/658 |
| 7,319,630 B2 * | 1/2008 | Wang et al. | 365/226 |
| 7,345,909 B2 * | 3/2008 | Chang et al. | 365/154 |
| 7,724,565 B2 * | 5/2010 | Barth et al. | 365/154 |
| 2003/0031040 A1 | 2/2003 | Hirano et al. | |

FOREIGN PATENT DOCUMENTS

| | | |
|---|---|---|
| CN | 1402353 A | 3/2003 |
| CN | 1992280 A | 7/2007 |

* cited by examiner

*Primary Examiner* — Viet Q Nguyen
(74) *Attorney, Agent, or Firm* — Patterson Thuente Christensen Pedersen, P.A.

(57) ABSTRACT

A capacity and density enhancement circuit for a sub-threshold memory unit array which can decrease the drain current in the bit lines and enhance the pull-up capability of memory cells. The capacity and density enhancement circuit is composed of a first enhancement transistor, a second enhancement transistor, a first mask transmission gate, a second mask transmission gate, a first logic memory capacitor and a second logic memory capacitor.

3 Claims, 4 Drawing Sheets

CAPACITY AND DENSITY ENHANCEMENT CIRCUIT FOR SUB-THRESHOLD MEMORY UNIT ARRAY

PRIORITY CLAIM

The present application is a National Phase entry of PCT Application No. PCT/CN2009/073248, filed Aug. 18, 2009, the disclosure of which is hereby incorporated by reference herein in its entirety.

FIELD OF THE INVENTION

The present invention is mainly designed to increase the number of memory cells that can be connected in series on the bit lines of a sub-threshold memory cell array, and thereby enhance the capacity and density of the memory cell array. The circuit mainly operates in the sub-threshold area (the supply voltage is lower than the threshold voltage of the transistors). The bit line is shielded from the drain current of matching transistors for unselected memory cells under the control of the shielding logic, so that the bit line logic is only subject to the power-up current of selected memory cells; in that way, the effect of the power-up current of selected memory cells to the oscillation amplitude of the bit line is enhanced, and therefore it is possible to implement memory cell arrays in large scales.

BACKGROUND OF THE INVENTION

A memory cell array is an important component in modern digital systems, and is often a bottleneck of power consumption in system design. As the demand for portable devices increases in the market, the requirement for technologies to reduce the power consumption of memory cell arrays becomes higher and higher. Sub-threshold design is a focus in extremely low power design nowadays. By reducing the supply voltage (Vdd) entering into the sub-threshold area of the circuit—Vdd lower than the threshold voltage (Vth), the system can operate in the linear range of the circuit, and thereby the dynamic and static power consumption of the system can be reduced significantly. The design of sub-threshold memory cell arrays further highlights the advantage of sub-threshold design in low-power consumption. However, in the actual implementation process, the design introduces a series of problems: 1) the power-up current/shutdown current ratio (Ion/Ioff) is low—in conventional designs, the power-up current/shutdown current ratio (Ion/Ioff) is approximately $10^7$, whereas in sub-threshold design, the Ion/Ioff ratio is only $10^3$-$10^4$; 2) the number of memory cells that can be connected in series on a bit line is limited, and therefore the capacity of a memory cell array is limited, and the area consumption is high; 3) in the read cycle, the oscillation amplitude of a bit line is low, and the detection tolerance of a sensitive amplifier is low; 4) the performance is susceptible to process deviations, etc. The key point in the problem is that the effect of drain current in the matching transistors for unselected logical memory cells on the bit line in the sub-threshold area is much more severe than the effect in the super-threshold area under the corresponding conditions. In addition, the effect will be further aggravated if there are process deviations. If there is not enough redundancy (the number of memory cells connected in series on the bit line is greater than a threshold), the power-up current of a selected memory cell may be interfered by the drain current accumulated in the unselected memory cells; as a consequence, the circuit can't recognize the correct logic subsequently, which will result in read and write failure of the memory cell (FIG. 1). In view of the process deviations and the bias voltage of the follow-up sensitive amplifier, the number of memory cells on a bit line will be further limited. At present, there are two trends in the design of sub-threshold memory cell arrays: 1) calculate the proportional relation of Ion/Ioff of the transistors within different process corners, and control the number of memory cells on the same bit line strictly; 2) introduce drain current compensation logic in the memory cell. However, the memory cell arrays are high-capacity logical units and have high requirements for design density. Both methods described above can't effectively solve the problem of large chip area consumption of memory cell array.

SUMMARY OF THE INVENTION

To solve the key problems in the existing sub-threshold memory circuits, on the basis of the characteristics of sub-threshold circuits, the present invention provides a capacity and density enhancing circuit for sub-threshold memory cell arrays, which can decrease the drain current in the bit lines and enhance the pull-up capability of the memory cells.

The Present Invention Employs the Following Technical Solution:

A capacity and density enhancing circuit for a sub-threshold memory cell array, comprising a first enhanced transistor, a second enhanced transistor, a first shielded transmission gate, a second shielded transmission gate, a first logical storage capacitor and a second logical storage capacitor, wherein the source end of the first enhanced transistor is connected with the source end of the second enhanced transistor and is connected to the supply voltage, the drain end of the first enhanced transistor is connected with the input/output end of the first shielded transmission gate and serves as one end of bit line of a memory cell array, the drain terminal of the second enhanced transistor is connected with the input/output end of the second shielded transmission gate and serves as the NOT end of bit line of the memory cell array, the body end of the first enhanced transistor is connected with the local grid end, the grid end of the first enhanced transistor is connected with one end of the first logical storage capacitor and connected to the output/input end of the first shielded transmission gate, the other end of the first logical storage capacitor is grounded, the body end of the second enhanced transistor is connected with the local grid end, the grid end of the second enhanced transistor is connected with one end of the second logical storage capacitor and connected to the output/input end of the second shielded transmission gate, the other end of the second logical storage capacitor is grounded, the control end of the first shielded transmission gate and second shielded transmission gate is used for input of enhanced control signal respectively, and the complementary control end of the first shielded transmission gate and second shielded transmission gate is used for NOT input of enhanced control signal respectively.

The present invention operates in the sub-threshold area, and can shield the effect of drain current in a bit line to the bit line logic automatically, therefore, it can increase the capacity and density of a memory cell array by several times, and is especially suitable for high-capacity and high-density sub-threshold memory cell arrays with extremely low power consumption.

Beneficial Effects:

(1) The logical voltage values on the complementary bit lines in an initial state are recorded and stored in the first logical storage capacitor and the second logical storage capacitor, respectively. In the read and write operation, the logical voltage values of complementary bit lines stored in the first logical storage capacitor and second logical storage capacitor are taken as the ON/OFF control signals for the first enhanced transistor and the second enhanced transistor, and the charging of the complementary bit lines by the supply voltage Vdd is controlled dynamically, so as to reduce the effect of drain current in unselected memory cells on the bit line in the sub-threshold area to the bit line logic.

(2) Memory cells working in sub-threshold area usually have poor pull-up capability. The circuit can regulate the pull-up driving power automatically according to the actual information stored in the memory cell array. Thus, the high logic electrical level on the bit lines can be recognized correctly even if there is no sensitive amplifier.

(3) The body end of the transistor is connected directly with the local grid end of the transistor. With the unique connection mode in the sub-threshold area: 1) when the transistor is in ON state, the threshold voltage is low, and the power-up current is high; 2) when the transistor is in OFF state, the threshold voltage is equal to the threshold voltage in the conventional connection mode, and therefore the electrical properties (e.g., shutdown current) are the same as those in the conventional connection mode. In this design mode, the Ion/Ioff ratio of the present invention is improved, and thereby the adverse effect of drain current to the performance of circuit in sub-threshold area is reduced.

(4) The chip area consumption of the present invention is low.

(5) The sequential control signal is simple, and therefore the errors introduced by high delay deviations of the circuits in the sub-threshold area are avoided.

(5) The present invention can be applied to a sub-threshold circuit design, and has the remarkable feature of extremely low power consumption.

(6) The present invention has a high tolerance to process deviations. As indicated in the result of a Monte Carlo analysis, the present invention can reduce the drain current in memory cells on a bit line reliably.

DETAILED DESCRIPTION OF THE EMBODIMENTS

Figure 2:
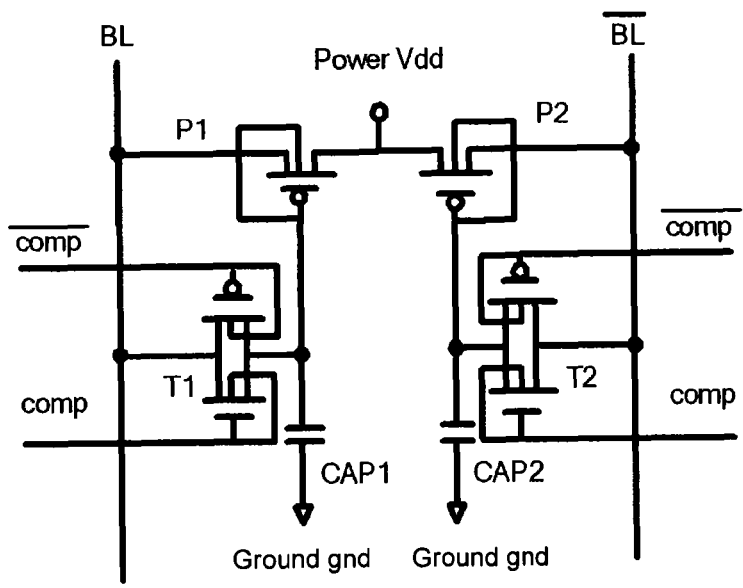
FIG. 2 shows structural diagrams of the capacity and density enhancing circuit for a sub-threshold memory cell array, wherein the FIG. 2(a) is a structural diagram of the first shielded transmission gate circuit in the present invention.
Figure 2A:
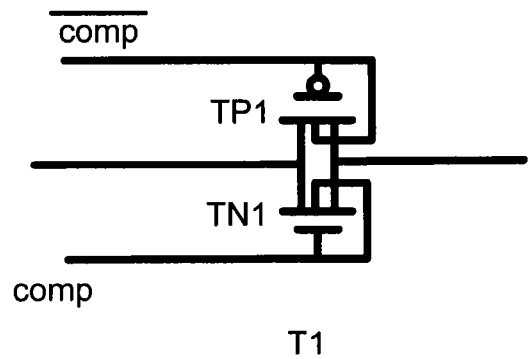
FIG. 2(b) is a structural diagram of the second shielded transmission gate circuit in the present invention.
Figure 2B:
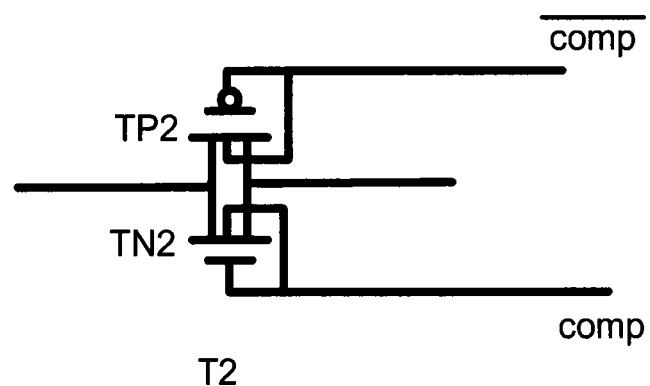

A capacity and density enhancing circuit for sub-threshold memory cell, as shown in FIG. 2, comprises a first enhanced transistor P1, a second enhanced transistor P2, a first shielded transmission gate T1, a second shielded transmission gate T2, a first logical storage capacitor CAP1, and a second logical storage capacitor CAP2, wherein, the source end of the first enhanced transistor P1 is connected with the source end of the second enhanced transistor P2 and is connected to the supply voltage, the drain end of the first enhanced transistor P1 is connected with the input/output end of the first shielded transmission gate T1 and serves as one end of bit line of a memory cell array, the drain end of the second enhanced transistor P2 is connected with the input/output end of the second shielded transmission gate T2 and serves as the NOT end of bit line of the memory cell array, the body end of the first enhanced transistor P1 is connected with the local grid end, the grid end of the first enhanced transistor P1 is connected with one end of the first logical storage capacitor CAP1 and is connected to the output/input end of the first shielded transmission gate T1, the other end of the first logical storage capacitor CAP1 is grounded, the body end of the second enhanced transistor P2 is connected with the local grid end, the grid end of the second enhanced transistor P2 is connected with one end of the second logical storage capacitor CAP2 and is connected to the output/input end of the second shielded transmission gate T2, the other end of the second logical storage capacitor CAP2 is grounded, the control end ($\overline{\text{comp}}$) of the first shielded transmission gate T1 and the second shielded transmission gate T2 is used for input of enhanced control signal respectively, the complementary control end (comp) of the first shielded transmission gate T1 and the second shielded transmission gate T2 is used for NOT input of enhanced control signal.

The first shielded transmission gate T1 consists of a first PMOS transistor TP1 and a first NMOS transistor TN1, wherein, the body end of the first PMOS transistor TP1 is connected with the local grid end and serves as the control end ($\overline{\text{comp}}$) of the first shielded transmission gate T1, the body end of the first NMOS transistor TN1 is connected with the local grid end and serves as the complementary control end (comp) of the first shielded transmission gate T1, the source end of the first PMOS transistor TP1 is connected with the drain end of the first NMOS transistor TN1 and serves as the input/output end or output/input end of the first shielded transmission gate T1, the drain end of the first PMOS transistor TP1 is connected with the source end of the first NMOS transistor TN1 and serves as the output/input end or input/output end of the first shielded transmission gate T1.

The second shielded transmission gate T2 consists of a second PMOS transistor TP2 and a second NMOS transistor TN2, wherein, the body end of the second PMOS transistor TP2 is connected with the local grid end and serves as the control end ($\overline{\text{comp}}$) of the second shielded transmission gate T2, the body end of the second NMOS transistor TN2 is connected with the local grid end and serves as the complementary control end (comp) of the second shielded transmission gate T2, the source end of the second PMOS transistor TP2 is connected with the drain end of the second NMOS transistor TN2 and serves as the input/output end or output/input end of the second shielded transmission gate T2, and the drain end of the second PMOS transistor TP2 is connected with the source end of the second NMOS transistor TN2 and serves as the output/input end or input/output end of the second shielded transmission gate T2.

Figure 3:
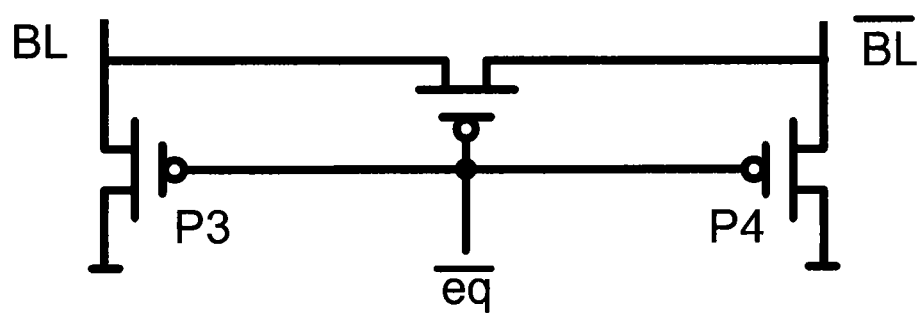
FIG. 3 shows the structure of a pre-charge/equalization circuit. The time sequence of the enhancing circuit in the present invention should work with the time sequence of a pre-charge/equalization circuit.

The present invention comprises enhanced PMOS transistors P1 and P2, shielded transmission gates T1 and T2, and logical storage capacitors CAP1 and CAP2. The source ends of the enhanced transistors P1 and P2 are directly connected to the supply voltage respectively, and the drain ends of the transistors are connected with a pair of complementary bit lines, respectively. The storage capacitors are directly connected with the grid ends of the enhanced transistors P1 and P2 and are connected to one end of shielded transmission gates T1 and T2, respectively. The other ends of shielded transmission gates T1 and T2 are connected with a pair of complementary bit lines, respectively. The time sequence of the entire enhanced logic should be used in conjunction with the pre-charge/equalization signal $\overline{eq}$ of pre-charge logic (FIG. 3) that is used in conventional memory cell arrays.

Figure 4:
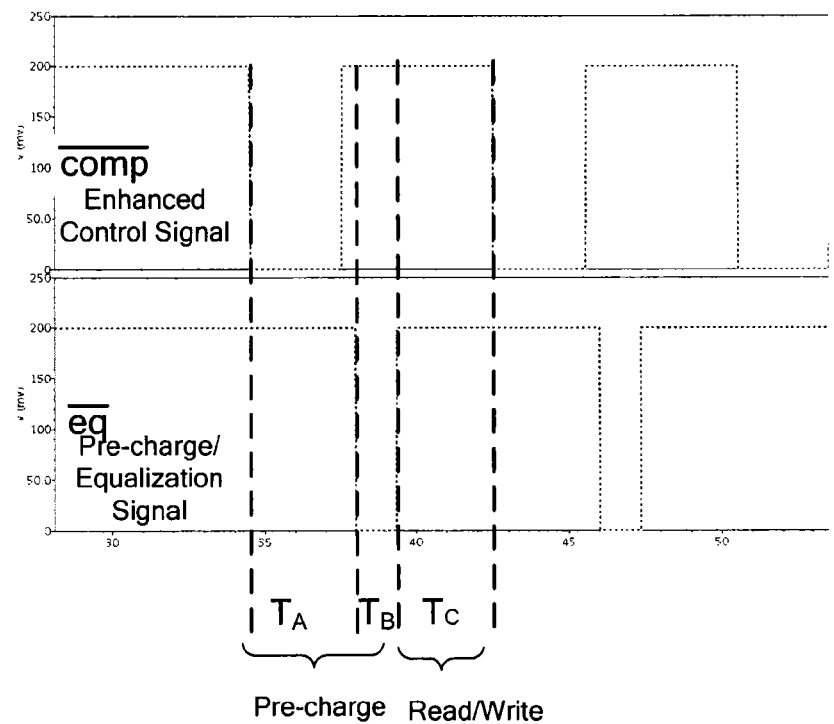
FIG. 4 shows the control sequence and waveform diagram of an enhancing circuit and pre-charge/equilibration circuit that work together.

FIG. 4 shows the sequential relationship between the control signal of the enhancing circuit and the pre-charge logic. In the cycle TA, the enhanced control signal $\overline{comp}$ is enabled, and therefore the transmission gates T1/T2 are turned on. Thus, the logical information of the complementary bit line pair in initial state is stored into the capacitors CAP1 and CAP2. In this cycle, since the information stored in the memory cells on the bit lines is different among the memory cells, the voltage information of the complementary bit line pair is also different and the specific values are between supply voltage Vdd and GND. In the cycle TB, the enhanced control signal $\overline{comp}$ is invalid, and the system enters into a pre-charge and equilibration cycle. The pair of complementary bit lines is pre-charged to the supply voltage Vdd. In addition, since the period is short and the shielded transmission gates T1 and T2 are in an OFF state, the effect of a logical voltage change on the bit lines to the information stored in the capacitors is not severe. It should be noted, in theory, when the system transits from the cycle TA to the cycle TB, at the end of storage of logical information of the bit lines in the capacitors at the rising edge of $\overline{comp}$, the logical level of the complementary bit lines can be increased directly following the falling edge of $\overline{eq}$ and the memory cell array is enabled to enter into the pre-charge cycle, however, in view of the demand for tolerance to process deviations, some margin is reserved in the sequential circuit in the actual design of the present invention between the rising edge of $\overline{comp}$ and the falling edge of $\overline{eq}$. The rising edge of $\overline{eq}$ indicates the start of cycle TC. In the cycle TC, the memory cell array enters into a read/write cycle. At this point, the enhancing circuit can regulate the charging of the complementary bit line pair by the supply voltage Vdd according to the charged potential of the capacitors.

Figure 1:
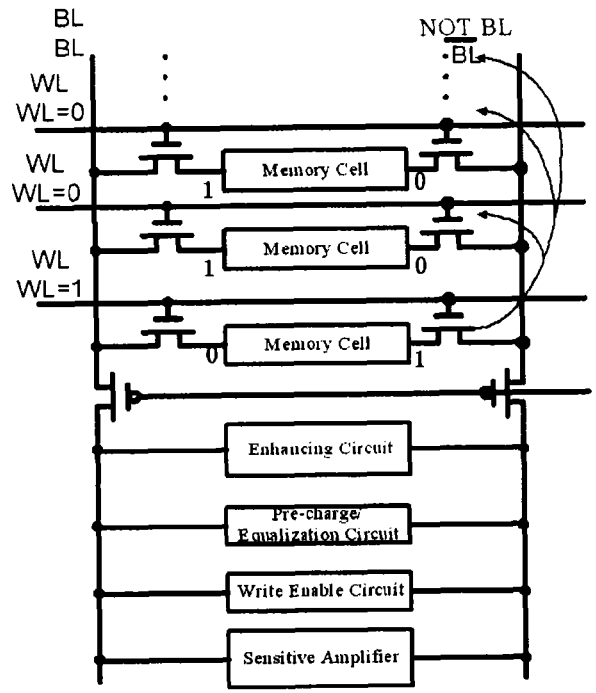
FIG. 1 shows a logic block diagram of a sub-threshold memory cell array and a schematic diagram of the influence of drain current on the bit line in the worst case.

In reading operation, the matching transistors for selected memory cells are controlled to turn on (the word line of the memory cells is "1", WL=1), the information stored in the memory cells is transmitted on the complementary bit line pair. Thus, theoretically, the potential of the bit line should be full zero, and the potential of the NOT bit line should be the entire supply voltage Vdd. However, due to the existence of capacitors on the bit line and the drain current accumulated in the unselected memory cells (the word line of the memory cells is "1", WL=0), the voltage of the bit line (BL) is greater than potential 0, while the voltage of the NOT $\overline{BL}$ is lower than Vdd (FIG. 1).

Figure 5:
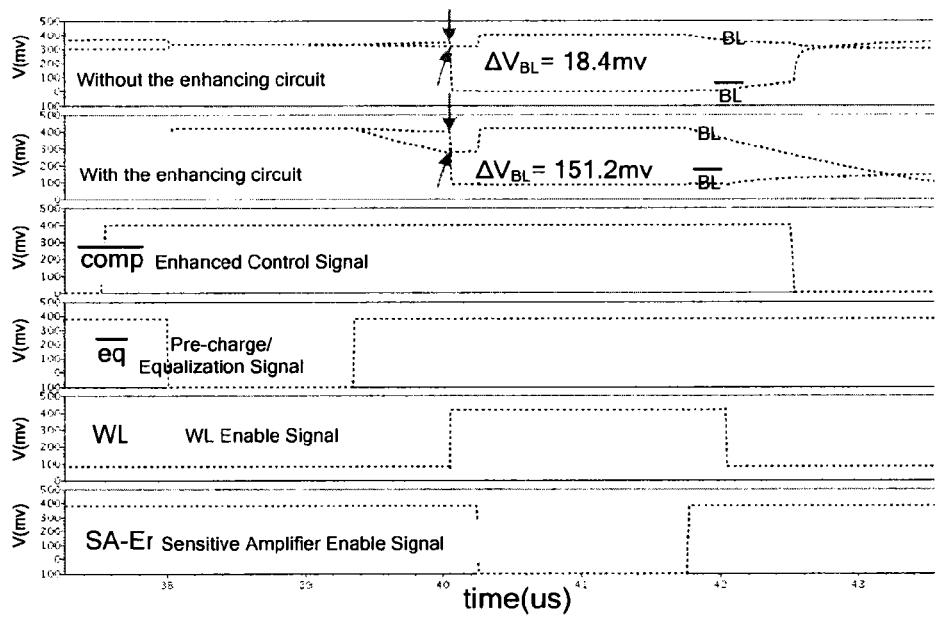
FIG. 5 shows a comparison between the waveform diagram of complementary bit lines that employ the enhancing circuit and the waveform diagram of complementary bit lines that don't employ the enhancing circuit, and the control signals for the bit lines.
Figure 6:
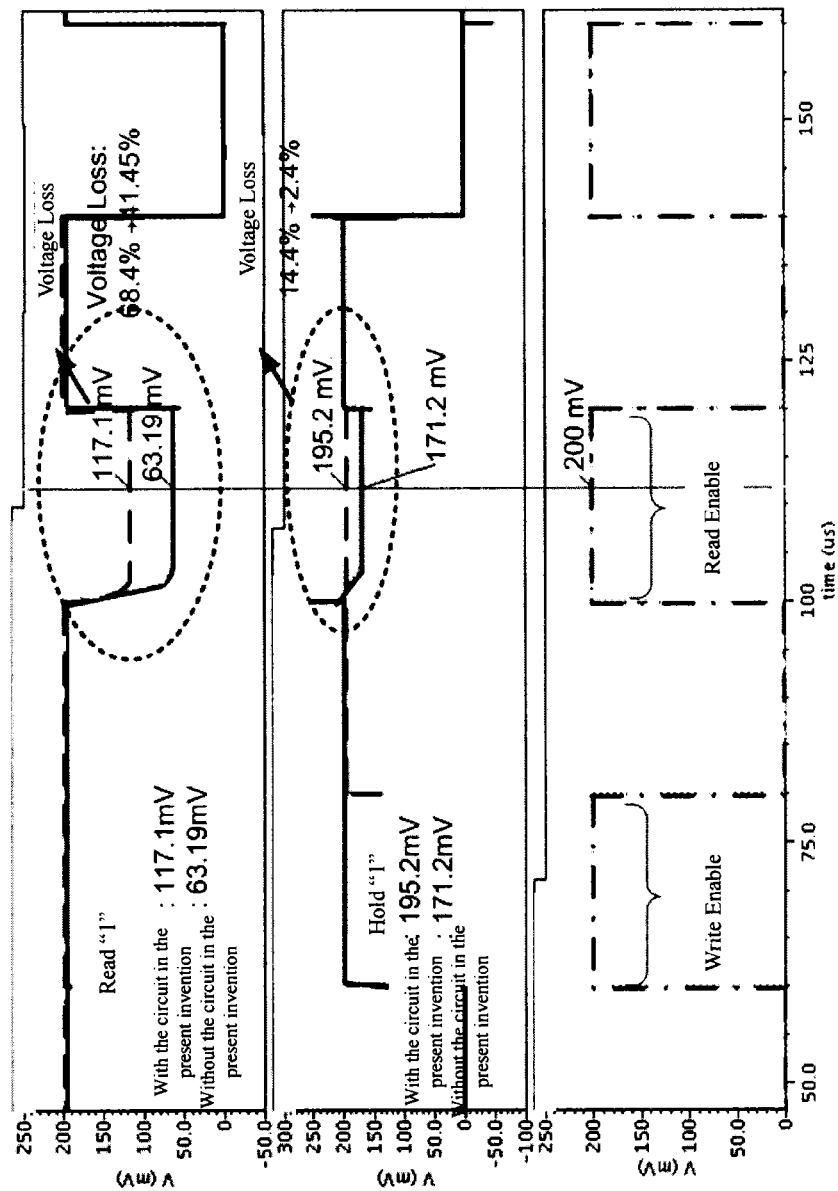
FIG. 6 shows the voltage signal on a bit line that employs the circuit in the present invention in the "1" reading operation and the voltage signal on a bit line that doesn't employ the circuit in the present invention in the "1" reading operation.

FIG. 5 shows the simulation test result of the effect of drain current to the oscillation amplitude of bit lines with 256 memory cells connected in series at 400 mV in the worst case (the selected memory cells store signal "1", while the unselected memory cells store signal "0", i.e., the drain current in the bit lines is the highest). It is seen from the figure, on the complementary bit line pair that doesn't employ the enhancing circuit, the voltage difference is very low (18.4 mV) due to the effect of drain current. After the enhancing circuit is employed on the complementary bit line pair, the voltage difference is increased from 18.4 mV to 151.2 mV. Thus, the follow-up sensitive amplifier has enough detection margin to detect correct read data. It is proven in tests that a sub-threshold memory cell array with 512 memory cells connected in series can still operate normally in the worst case with the circuit provided in the present invention. That is to say, the memory cell arrays that employ the circuit provided in the present invention can support more memory cells. The sub-threshold memory cell arrays that employ the circuit provided in the present invention can have higher capacity and density.

Actually, when the supply voltage further decreases, the driving power of a P-type transistor is significantly lower than that of an N-type transistor (the minimum drain current of a P-type transistor is approximately 22% of an N-type transistor under $|Vds|=|Vgs|=200$ mV, 0.13 µm process). To fully verify the pull-up capability of the present invention, a comparison is made for sub-threshold memory cell arrays with 64 memory cells connected in series on the same bit line at 200 mV in the worst case, by reading the potential information from the bit line in a sub-threshold memory cell array that doesn't employ the circuit in the present invention and a sub-threshold memory cell array that employs the circuit in the present invention during "1" reading operation: the potential information read from the bit line in the sub-threshold memory cell array that employs the circuit in the present invention during "1" reading operation is 117.1 mV, while the potential information read from the bit line in the sub-threshold memory cell array that doesn't employ the circuit in the present invention during "1" reading operation is 63.19 mV. Due to the pull-up effect of the circuit provided in the present invention, the voltage loss on the read bit line during "1" reading operation is reduced from 68.4% to 41.45%, which indicates the circuit provided in the present invention can greatly alleviate the problem of reading error resulting from the poor driving power of P-type transistors in the reading operation, break through the limitation to the number of memory cells permitted on the same bit line, and increase the capacity and density of sub-threshold memory cell arrays.

According to the design described above, the present invention doesn't require large-size transistors, and the unit density can be low. Since a bit line can support more memory cells, memory cell arrays implemented with the circuit provided in the present invention can have higher capacity and higher overall density.

The invention claimed is:

1. A capacity and density enhancing circuit for a sub-threshold memory cell, comprising:
a first enhanced transistor, a second enhanced transistor, a first shielded transmission gate, a second shielded transmission gate, a first logical storage capacitor, and a second logical storage capacitor, wherein, a source end of the first enhanced transistor is connected with a source end of the second enhanced transistor and is connected to a supply voltage, a drain end of the first enhanced transistor is connected with an input/output end of the first shielded transmission gate and serves as one end of a bit line of a memory cell array, a drain end of the second enhanced transistor is connected with an input/output end of the second shielded transmission gate and serves as a NOT end of the bit line of the memory cell array, a body end of the first enhanced transistor is connected with a local grid end, a grid end of the first enhanced transistor is connected with one end of the first logical storage capacitor and is connected to the output/input end of the first shielded transmission gate, another end of the first logical storage capacitor is grounded, a body end of the second enhanced transistor is connected with the local grid end, a grid end of the second enhanced transistor is connected with one end of the second logical storage capacitor and connected to the output/input end of the second shielded transmission gate, another end of the second logical storage capacitor is grounded, a control end of the first shielded transmission gate and second shielded transmission gate is used for input of an enhanced control signal, a complementary control end of the first shielded transmission gate and second shielded transmission gate is used for a NOT input of the enhanced control signal.

2. The capacity and density enhancing circuit for a sub-threshold memory cell array according to claim 1, wherein,
the first shielded transmission gate consists of a first PMOS transistor and a first NMOS transistor, a body end of the first PMOS transistor is connected with the local grid end and serves as the control end of the first shielded transmission gate, a body end of the first NMOS transistor is connected with the local grid end and serves as the complementary control end of the first shielded transmission gate, a source end of the first PMOS transistor is connected with a drain end of the first NMOS transistor and serves as the input/output end or output/input end of the first shielded transmission gate, and a drain end of the first PMOS transistor is connected with a source end of the first NMOS transistor and serves as the output/input end or input/output end of the first shielded transmission gate.

3. The capacity and density enhancing circuit for sub-threshold memory cell array according to claim 1, wherein
the second shielded transmission gate consists of a second PMOS transistor and a second NMOS transistor, a body end of the second PMOS transistor is connected with the local grid end and serves as the control end of the second shielded transmission gate, a body end of the second NMOS transistor is connected with the local grid end and serves as the complementary control end of the second shielded transmission gate, a source end of the second PMOS transistor is connected with a drain end of the second NMOS transistor and serves as the input/output end or output/input end of the second shielded transmission gate, and a drain end of the second PMOS transistor is connected with the source end of the second NMOS transistor and serves as the output/input end or input/output end of the second shielded transmission gate.

* * * * *